United States Patent [19]
Wyland

[11] Patent Number: 5,784,255
[45] Date of Patent: Jul. 21, 1998

[54] DEVICE AND METHOD FOR CONVECTIVE COOLING OF AN ELECTRONIC COMPONENT

[75] Inventor: Christopher P. Wyland, Santa Clara, Calif.

[73] Assignee: Integrated Device Technology, Inc., Santa Clara, Calif.

[21] Appl. No.: 566,757

[22] Filed: Dec. 4, 1995

[51] Int. Cl.$^6$ ............................................. H05K 7/20
[52] U.S. Cl. ........................ 361/692; 165/80.3; 174/16.3; 257/707; 361/704
[58] Field of Search ................................ 174/16.1, 16.3, 174/15.1; 165/80.3, 185, 122, 126, 108, 129, 128, 900, 131; 257/706, 707, 713, 720–722; 361/690, 692, 693, 704, 705, 706, 709–711, 717–720

[56] References Cited

U.S. PATENT DOCUMENTS

| | | | |
|---|---|---|---|
| 4,036,292 | 7/1977 | Hine, Jr. ..................... | 165/122 |
| 4,222,434 | 9/1980 | Clyde ........................ | 165/10 |
| 4,261,005 | 4/1981 | McCarthy .................... | 174/16.3 |
| 4,449,164 | 5/1984 | Carlson et al. ............... | 361/384 |
| 5,063,475 | 11/1991 | Balan ........................ | 361/692 |
| 5,111,280 | 5/1992 | Iversen ...................... | 357/82 |
| 5,132,875 | 7/1992 | Plesinger .................... | 361/386 |
| 5,172,756 | 12/1992 | Jayamanne .................... | 165/80.3 |
| 5,212,625 | 5/1993 | van Andel et al. ............. | 361/383 |
| 5,369,550 | 11/1994 | Kwon ........................ | 361/690 |

*Primary Examiner*—Gerald P. Tolin
*Attorney, Agent, or Firm*—Skjerven, Morrill, MacPherson, Franklin & Friel

[57] ABSTRACT

A heat sink mounted on an electronic component causes a thermal plume effect so that air adjacent to the electronic component moves through one or more channels in the heat sink in a direction substantially transverse to and away from the electronic component. The heat sink includes a base attachable to the electronic component, a support member mounted on and substantially transverse to the base, and a heat exchanger mounted on the support member and spaced away from the base. The heat exchanger has at least one entry hole adjacent to the base, at least one exit hole at a distance from the entry hole, and one or more channels adjacent to the support member and in flow communication with the entry hole and the exit hole.

18 Claims, 4 Drawing Sheets

DEVICE AND METHOD FOR CONVECTIVE COOLING OF AN ELECTRONIC COMPONENT

FIELD OF THE INVENTION

This invention generally relates to cooling of packaged electronic components, and in particular to a device and method for natural (also called "free") convective cooling of an electronic component.

BACKGROUND OF THE INVENTION

A packaged electronic component (hereinafter electronic component), such as a multichip module or a plastic packaged integrated circuit, generates a large amount of heat during operation. Such electronic components can be cooled by a variety of heat sink devices and methods, as described in, for example, U.S. Pat. Nos. 4,449,164, 5,369,550, 5,212, 625 and 5,111,280.

Heat sinks based on forced convective cooling typically use a fan or a pump. However, devices and methods for forced convective cooling of electronic components are complex, expensive, and consume energy.

SUMMARY OF THE INVENTION

In accordance with this invention, an electronic heat sink (hereinafter "heat sink") for cooling an electronic component has a base that supports a heat exchanger. The heat exchanger has one or more channels formed in a direction substantially transverse to the base. During operation, air adjacent to the electronic component heats up and moves on its own through the heat exchanger's channels, away from the electronic component, and thereby cools the electronic component.

In one embodiment, the heat sink includes a support member mounted on and substantially transverse to the base, with the heat exchanger mounted on the support member at a distance (called "spacing distance") from the base. The heat exchanger has at least one entry hole adjacent to the base, at least one exit hole at a distance from the entry hole, and one or more channels in flow communication with the entry hole and the exit hole.

The heat sink can be formed of any thermally conductive material, such as copper. In one embodiment, the heat sink is formed of a predetermined material selected to minimize the difference in the coefficients of thermal expansion of the heat sink and the electronic component. In this embodiment, using a thermally conductive adhesive, e.g. epoxy resin, the heat sink is mounted on the hottest portion of an electronic component. In two alternate embodiments, the heat sink's base is partially or completely embedded underneath the surface of the electronic component during injection molding to form the electronic component's package.

During operation of the electronic component, the support member receives heat from the electronic component through the base member, transfers a portion of the received heat to air in contact with the support member and transfers another portion of the received heat to the heat exchanger. The heat sink has a thermal gradient, with the hottest part being the base and the coolest part being the heat exchanger's distal end located farthest from the base. The thermal gradient causes air in one or more channels of the heat exchanger to flow from the entry hole to the exit hole. The air flow can be either laminar or turbulent, depending on the Reynolds number which is a function, among other things of the surface roughness of various parts of the heat sink.

Turbulent air flow is preferable and results in a greater heat transfer because of greater mixing of hot and cold air, as compared to laminar air flow which is slower.

In one specific embodiment, a circular plate forms the base of the heat sink and a rod mounted in the center of the plate forms the support member. In this embodiment, the heat exchanger includes a tube and one or more radial members (e.g. radial walls or spokes) that connect the tube to the rod. The tube has a length smaller than the length of the rod, and is spaced away from the plate. The two ends of the tube are open, and form the entry and exit holes of the heat exchanger. During operation, air adjacent the plate enters the tube through the entry holes, travels adjacent to the rod, and leaves the tube through the exit holes, in a direction transverse to the plate. So, the heat sink causes movement of air and cools the electronic component by natural convection, without the need for fans or pumps used in the prior art.

The above described tubular heat sink can be formed either integrally (for example, by extrusion) or from discrete parts (for example, by soldering, welding or brazing). The tubular heat sink can also have a number of external holes formed in the tube or internal holes formed in the radial walls, to improve the heat transfer from the heat exchanger to the air.

In one specific embodiment, the heat sink has a heat exchanger formed of a sponge that defines one or more channels adjacent to the rod. Such a heat sink functions in a manner similar to that described above, except that the large surface area of the sponge provides a greater cooling effect than possible by using a tubular heat sink.

DETAILED DESCRIPTION

According to the principles of this invention, an electronic heat sink for cooling an electronic component enhances a thermal plume effect associated with heated surfaces. Specifically, the heat sink includes a heat exchanger that has one or more channels formed in a direction substantially transverse to the base of the heat sink, so that air adjacent to the electronic component is heated and moves on its own through the heat exchanger's channels, away from the electronic component, and thereby cools the electronic component. The heat sink can be mounted at any angle on an electronic component, although in one embodiment, the heat sink is mounted substantially vertically and substantially perpendicular to a surface of the electronic component.

Figure 1A:
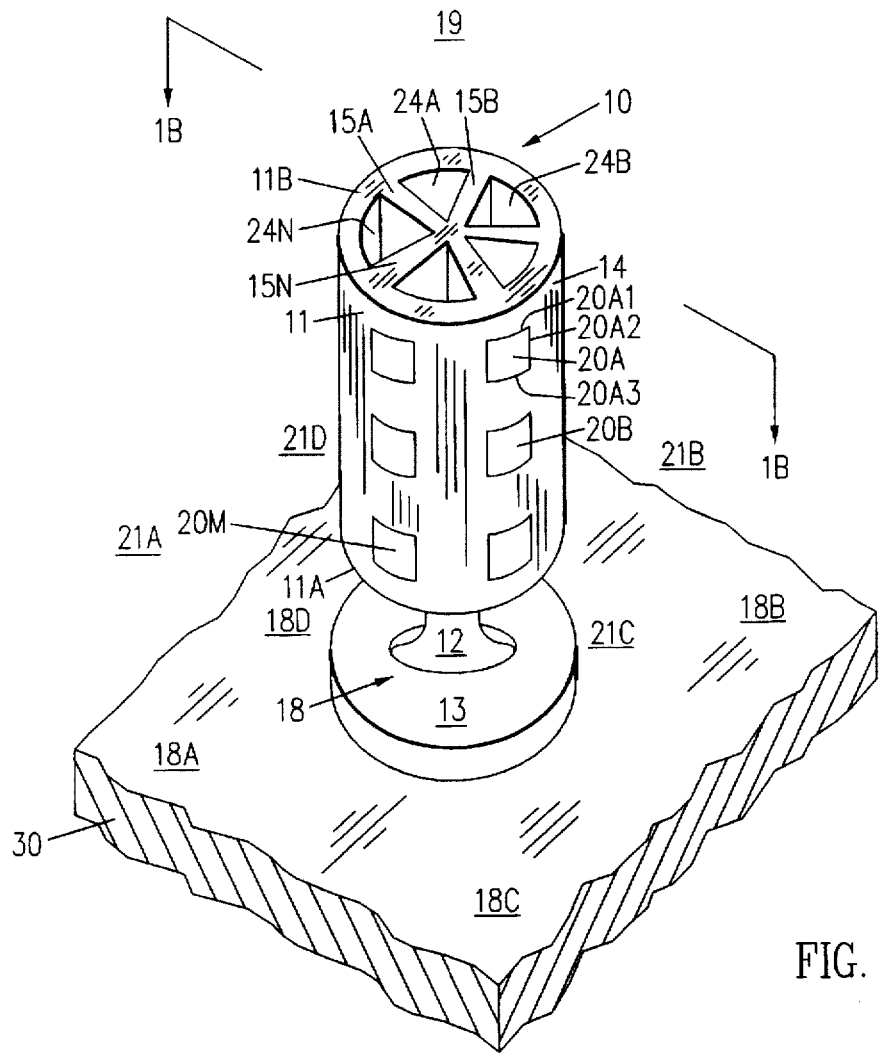
FIG. 1A illustrates a tubular heat sink in accordance with this invention.

In one embodiment of this invention, a heat sink 10 (FIG. 1A) includes a heat exchanger 11 surrounding and substantially supported by a support member 12 that in turn is mounted on a base 13. Heat exchanger 11 has a proximal end 11A facing the base 13 and spaced at a distance (also called "spacing distance") L1 (FIG. 1C) away from the base 13. Heat exchanger 11 also has a distal end 11B that is opposite to and located at a distance L2 from proximal end 11A. In this embodiment, length L2 of heat exchanger 11 is smaller than length L3+t of support member 12, so that spacing distance L1=L3−L2, where t is the thickness of base 11.

In this embodiment, heat exchanger 11 is formed of a tube 14 (FIG. 1A) that is supported by a number of walls 15A–15N that are radially located around and connected to support member 12. Heat exchanger 11 and support member 12 can be formed of any predetermined materials e.g. conductive materials such as aluminum or copper alloys selected to minimize the difference in the coefficients of thermal expansion of heat sink 10 and electronic component 30. In one embodiment, heat exchanger 11 is formed of materials with a predetermined surface roughness selected to cause turbulent air flow through heat exchanger 11.

Walls (also called radial walls) 15A–15N (FIG. 1B) can be connected by a number of joints, such as joints 16A–16D formed by, for example, soldering, brazing, or welding. Alternatively, tube 14, walls 15A–15N and support member 12 can all be formed together by an extrusion process, followed by machining away portions of tube 14 and walls 15A–15N through a distance (L1+t) (FIG. 1C), and forming in support member 12 a threaded portion 12A of length t for assembly into a threaded hole 13A of base 13.

Tube 14 is open at both proximal end 11A and distal end 11B. Therefore tube 14 and walls 15A–15N together define respective entry holes 23A–23N (FIG. 1B) and exit holes 24A–24N (not all N entry holes and exit holes are labeled). Tube 14 and walls 15A–15N also define a number of channels 17A–17N (not all N channels are labeled in FIG. 1B) of length L2 (FIG. 1C) adjacent to support member 12 and in flow communication with respective entry holes 23A–23N and exit holes 24A–24N (see also, entry hole 23C and exit hole 24C in FIG. 1C).

In one specific embodiment, tube 14 (FIG. 1B) is formed of copper and has a diameter D=1 inch and a wall thickness T=1/16 inch. In this embodiment, radial walls 15A–15N are five in number, each of thickness W=1/160 inch, and support member 12 is a cylindrical copper rod of diameter d=¼ inch. Moreover, in this embodiment, length L2 (FIG. 1C) of tube 14 is ¾ inch and length L3+t of support member 12 is 1 inch. Also in this embodiment, base 13 is a copper plate with a diameter b=1 inch and a thickness t=⅛ inch.

Figure 1B:
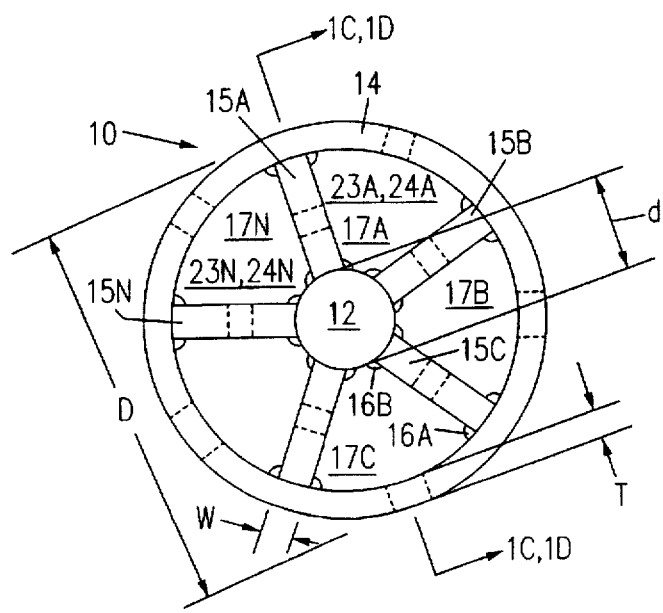
FIG. 1B illustrates a top view of the tubular heat sink in FIG. 1A in the direction 1B—1B.

Base 13 can be mounted in any manner on electronic component 30 (FIG. 1C), for example, using a thermally conductive adhesive 31, such as an epoxy resin. Base 13 is mounted so that heat from electronic component 30 travels through base 13 into support member 12. Support member 12 transfers at least a portion of the received heat directly to the air in contact with support member 12, for example, the air in channels 17A–17N (FIG. 1B) . Support member 12 also transfers a portion of the received heat to heat exchanger 11 that in turn transfers the heat to the air in channels 17A–17N and also to the air in regions 21A–21D (FIG. 1A) surrounding the heat exchanger 11.

Heat sink 10 (FIG. 1A) has a thermal gradient, with base member 13 being the hottest part and distal end 11B of heat exchanger 11 being the coolest part. The thermal gradient causes air in channels 17A–17N (FIG. 1B) adjacent to support member 12 to move from proximal end 11A to distal end 11B. As the air exits from tube 14 at second end 11B, into region 19, ambient air from spacing region 18 between first end 11A and base member 13 enters channels 17A–17N, and air from regions 18A–18D adjacent electronic component 30 enters spacing region 18. Therefore, heat sink 10 uses a thermal plume effect to cause air adjacent to electronic component 30 to enter tube 14, pass through channels 17A–17N, and exit through holes 24A–24N, without the need for a prior art fan or blower. Such moving air cools electronic component 30 much better than still air used in prior art heat sinks that do not use a fan or blower.

In this specific embodiment, heat sink 10 also defines a number of external holes 20A–20M (not all M external holes are labeled in FIGS. 1A and 1C) in tube 14. External holes 20A–20M allow cold ambient air to enter heat exchanger 11 from surrounding regions 21A–21D and assist in dissipating the heat from support member 12. External holes 20A–20M also provide additional surface area, such as the area of sides 20A1–20A4, to enhance the cooling effect of heat sink 10. Note that heat sink 10 also dissipates heat through both the inner tube surface 14I (FIG. 1C) and the outer tube surface 14O of tube 14.

Also in this embodiment, heat sink 10 defines a number of internal holes 22A–22P (where P is the total number of internal holes) in walls 15A–15N. Internal holes 22A–22P allow movement of air inside heat exchanger 11, between channels 17A–17N, and thereby further assist in transferring heat to the air in tube 14. Internal holes 22A–22P also provide additional surface area, such as sides 22A1–22A4, to enhance the cooling effect of heat sink 10. Internal holes 22A–22P also cause turbulence in one embodiment and so further enhance the cooling effect.

Figure 1C:
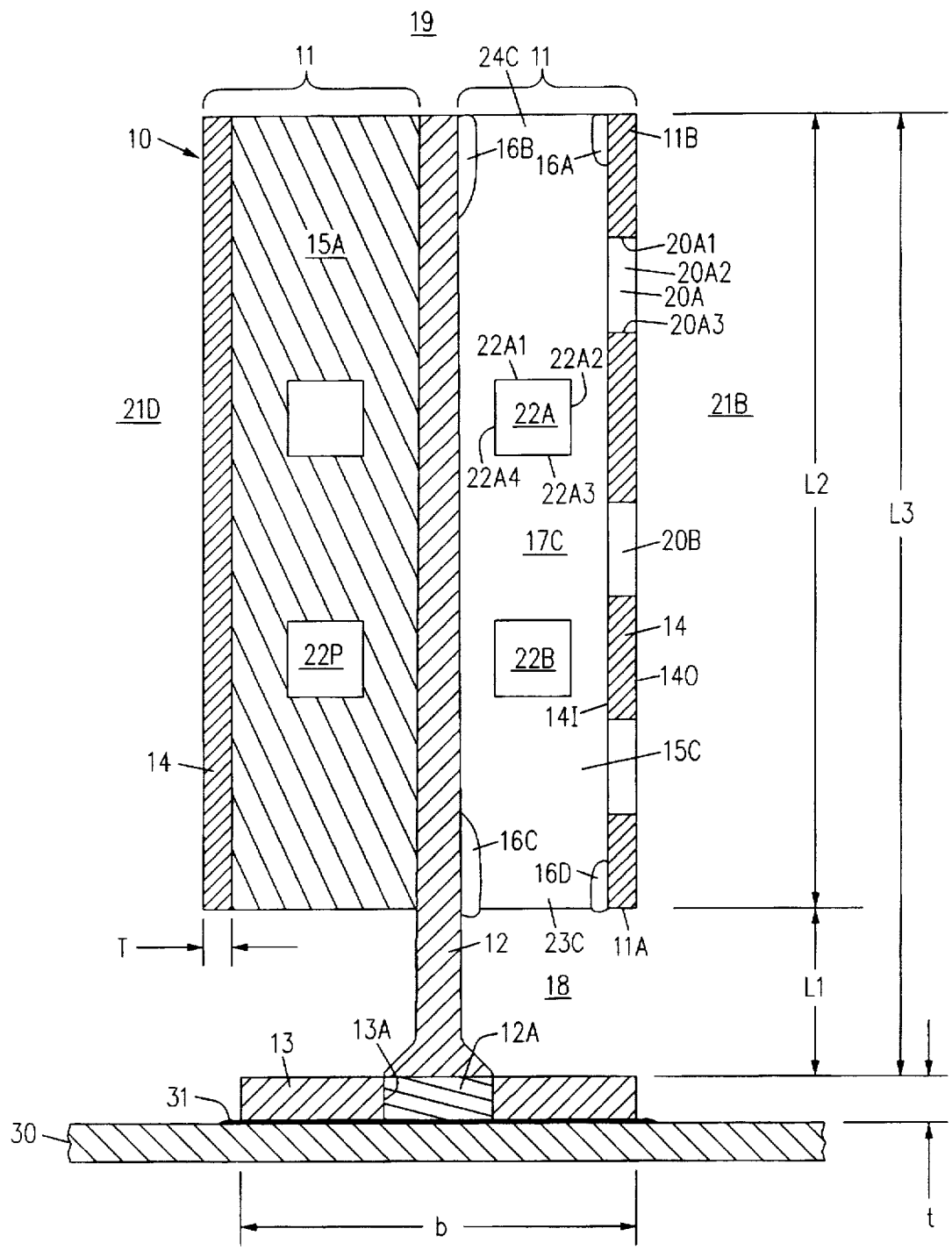
FIGS. 1C and 1D illustrate cross sectional views in the direction 1C—1C and 1D—1D of two variants of the tubular heat sink of FIG. 1B.
Figure 1D:
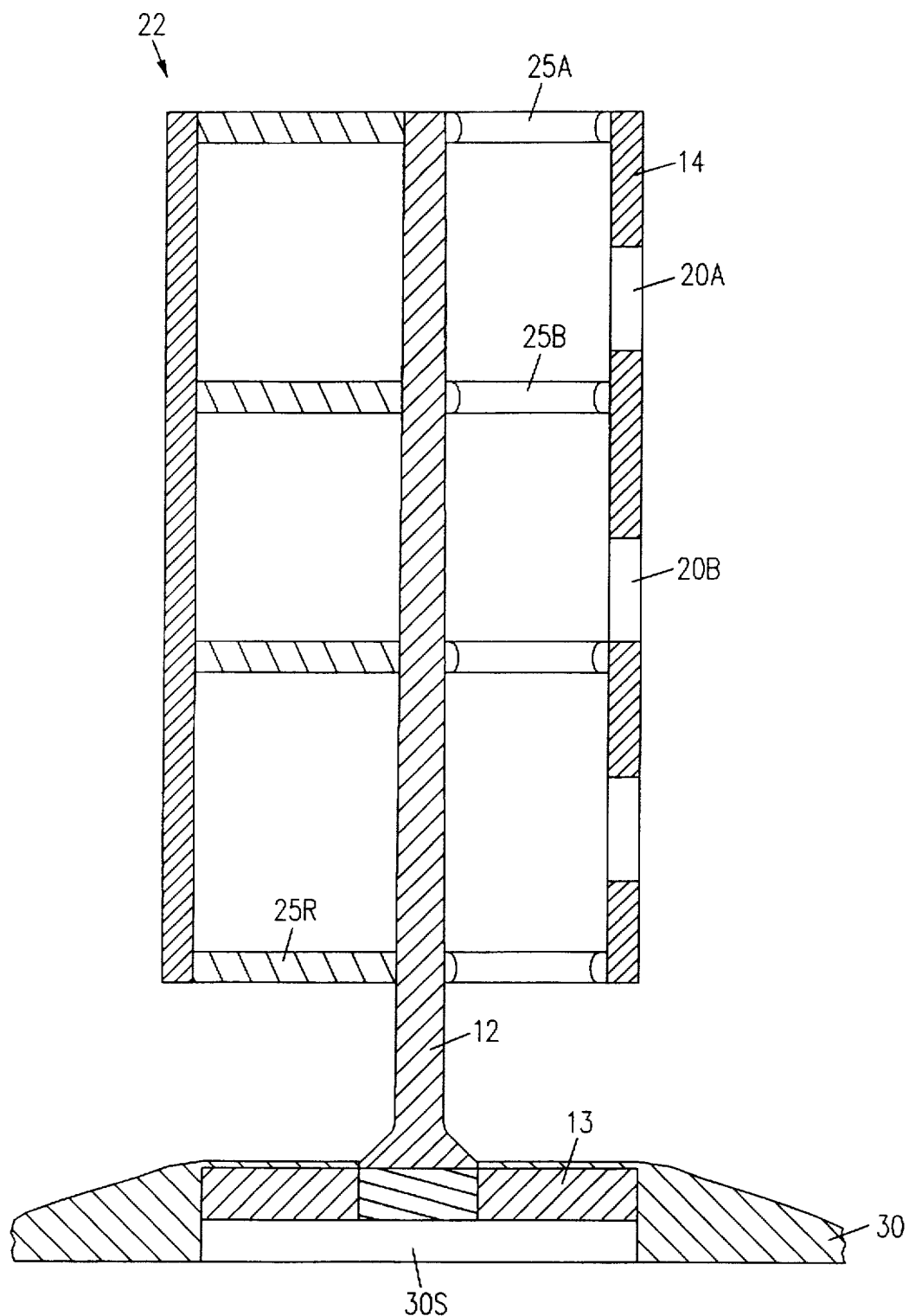

In another embodiment, a heat sink 22 (FIG. 1D) is similar to heat sink 10 (FIG. 1C), except that instead of walls 15A–15N, heat sink 22 (FIG. 1D) has a number of spikes 25A–25R, (not all R spikes are labeled in FIG. 1D) that connect tube 14 to support member 12 (for convenience, the same reference numerals are used for similar parts in FIGS. 1C and 1D). Spikes 25A–25R eliminate the need to form internal holes 22A–22P (FIG. 1C) in walls 15A–15N, as was necessary for heat sink 10. Also in this embodiment, base 13 (FIG. 1D) of heat sink 22 is embedded in electronic component 30, in contact with a slug 30S, during injection molding of the package of electronic component 30.

Although in two embodiments, walls 15A–15N and spikes 25A–25R are described above, any other type of radial member can be used to connect a tube to a support member. Moreover, heat sinks 10 and 22 can be mounted on an electronic component to minimize the "junction-to-case" resistance, for example, using thermal epoxy or thermal grease, as apparent to those skilled in the art of heat sinks in view of the enclosed disclosure.

In another embodiment, heat sink 35 (FIG. 2) has a heat exchanger 36 formed of a sponge that has a large number of pores 39A–39P (not all P pores are numbered in FIG. 2) and so eliminates the need to form internal and external holes described above. In three variants of this embodiment, heat exchanger 36 is formed from an aluminum sponge having 10, 20 or 40 pores per inch. The aluminum sponge can be, for example, "Duocell" by made by ERG Materials & Aerospace Corporation, 900 Stanford Avenue, Oakland, Calif. 94608.

In this embodiment, a number of channels 37A–37S (not all S channels are labeled in FIG. 2) are formed adjacent support member 12, between proximal end 36A and distal end 36B of heat exchanger 36. At least a majority (>50%) of pores 39A–39P are interconnected to channels 37A–37S to permit movement of air from surrounding region 33 into channels 37A–37S. Heat exchanger 36's sponge can be formed of a large number of criss-crossing strands only sufficient to offer resistance to the movement of air from surrounding region 33, through the sponge, into channels 37A–37S, while not completely eliminating such movement. As the heat generated by an electronic component increases, a larger amount of air passes into channels 37A–37S through pores 39A–39P and so increases the heat dissipated by heat sink 35. Heat exchanger 36 has a larger surface area and therefore provides a greater cooling effect than heat exchanger 11 formed of a tube 14 and walls 15A–15N.

Figure 2:
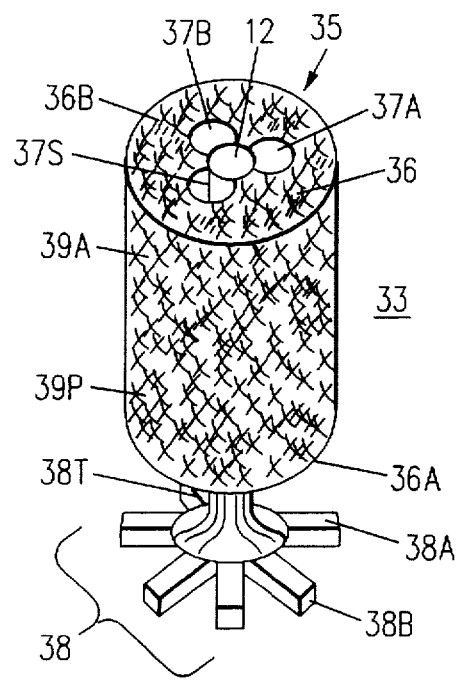
FIGS. 2 and 3 illustrate in perspective views, two alternate embodiments of the heat sink of this invention.

In this embodiment, instead of having a solid plate as the base, heat sink 35 includes a base 38 formed of a number of roots 38A–38T (not all T roots are labeled in FIG. 2). Base 38 can be used as a crimp to mount heat sink 35 on a plastic package (not shown in FIG. 2), without an adhesive. Note that instead of base 38, a sold base, such as base 18 (FIG. 1A) can be used with a heat exchanger 36 to form another embodiment of a heat sink.

Figure 3:
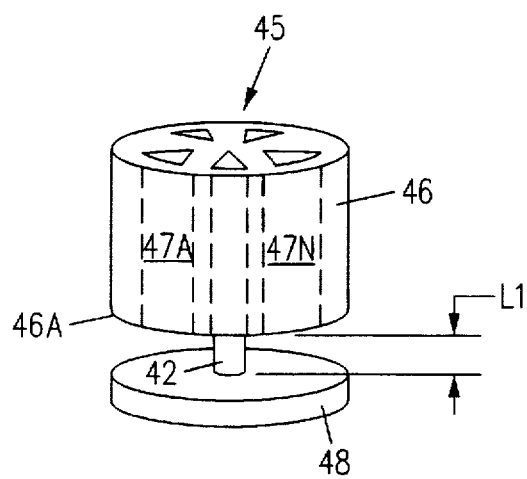

In still another embodiment, a support member 42 (FIG. 3) of a heat sink 45 has a length L1 equal to only the spacing distance between a base member 48 and proximal end 46A of heat exchanger 46. Heat exchanger 46 is mounted at proximal end 46A to the end of support member 42, and support member 42 does not extend through the length of heat exchanger 46 in this embodiment.

Also in this embodiment, heat exchanger 46 has channels 47A–47N (shown dotted) formed substantially perpendicular to base member 48, but is devoid of any internal or external holes along the length of heat exchanger 46. Heat sink 45 is easier and less expensive to manufacture than, for example, heat sinks 10 and 35.

Although certain preferred embodiments have been described above, the above description is illustrative only and not limiting. Other embodiments of this invention will be apparent to those skilled in the art of designing electronic heat sinks in view of the disclosure. For example, although the heat exchanger is mounted spaced away from the base in the embodiments described above, the heat exchanger can be mounted in contact with the base (or in contact with the electronic component surface, if the base is embedded) if the heat exchanger has one or more large external holes formed transverse to and adjacent to the base.

Moreover, in other embodiments, the heat exchanger can be mounted at an angle inclined with respect to the base. Also, a heat sink can be mounted at any location on an electronic component and can be oriented horizontally or even mounted upside-down, e.g., with distal end 11B (FIG. 1A) closer to the earth's center than proximal end 11A.

Numerous variations and modifications of the invention described herein are encompassed by the attached claims.

I claim:

1. A heat sink for cooling an electronic component, said heat sink comprising:

a base;

a support member connected to said base; and a heat exchanger supported substantially on said support member and surrounding at least a substantial portion of said support member, wherein:

said heat exchanger defines at least one entry hole adjacent said base and at least one exit hole at a distance from said entry hole, said exit hole being in flow communication with ambient air adjacent to said heat sink, said distance being sufficient for a thermal gradient in said heat exchanger between said entry hole and said exit hole to cause movement of ambient air from said entry hole to said exit hole by natural convection;

said heat exchanger defines at least one channel adjacent said support member and in flow communication with said entry hole and said exit hole;

said heat exchanger comprises a tube and at least one radial member extending radially from said support member to said tube, said tube surrounding said support member and located approximately concentric with said support member; and said heat exchanger is devoid of a fan for moving said air.

2. The heat sink of claim 1 wherein said support member, said tube and said radial member are portions of an integral structure.

3. The heat sink of claim 1 wherein said tube is cylindrical.

4. The heat sink of claim 1 wherein said tube defines a plurality of entry holes including said entry hole, each entry hole being in flow communication with a region outside said tube and adjacent to said base.

5. The heat sink of claim 1 wherein said radial member comprises a wall.

6. The heat sink of claim 5 wherein said radial wall defines a plurality of internal holes.

7. The heat sink of claim 1 wherein said radial member comprises a spoke.

8. A heat sink for cooling an electronic component, said heat sink comprising:

a base;

a support member connected to said base; and a heat exchanger supported substantially on said support member and surrounding at least a substantial portion of said support member, wherein:

said heat exchanger defines at least one entry hole adjacent said base and at least one exit hole at a distance from said entry hole, said exit hole being in flow communication with ambient air adjacent to said heat sink, said distance being sufficient for a thermal gradient in said heat exchanger between said entry hole and said exit hole to cause movement of ambient air from said entry hole to said exit hole by natural convection;

said heat exchanger defines at least one channel adjacent said support member and in flow communication with said entry hole and said exit hole; and said heat exchanger comprises a cylindrical wall and a plurality of radial walls, each radial wall extending radially from said support member to said cylindrical wall.

9. The heat sink of claim 8 wherein said cylindrical wall defines a plurality of entry holes including said entry hole.

10. The heat sink of claim 8 wherein said support member, said cylindrical wall and said radial wall are portions of an integral structure.

11. A heat sink for cooling an electronic component, said heat sink comprising:

a base;

a support member connected to said base; and a heat exchanger supported substantially on said support member and surrounding at least a substantial portion of said support member, wherein:

said heat exchanger defines at least one entry hole adjacent said base and at least one exit hole at a distance from said entry hole, said exit hole being in flow communication with ambient air adjacent to said heat sink, said distance being sufficient for a thermal gradient in said heat exchanger between said entry hole and said exit hole to cause movement of ambient air from said entry hole to said exit hole by natural convection;

said heat exchanger defines at least one channel adjacent said support member and in flow communication with said entry hole and said exit hole; and said heat exchanger comprises a sponge.

12. An assembly comprising an electronic module and a heat sink mounted on said electronic module, said heat sink comprising:

a base attached to said electronic module;

a support member connected to said base; and a heat exchanger having a length smaller than the length of said support member and supported on said support member, said heat exchanger defining at least one entry hole facing said base, said heat exchanger further defining at least one exit hole and a channel adjacent said support member in flow communication with said entry hole and said exit hole.

13. The assembly of claim 12 wherein said base is mounted in intimate thermal contact with a portion of said electronic component to minimize the junction to case resistance.

14. The assembly of claim 13 wherein said base of said heat sink is embedded in said electronic component and wherein said portion of said electronic component is a copper slug.

15. A method for cooling an electronic component comprising:

generating heat in said electronic component, said heat passes from said electronic component into a support member mounted transverse to said electronic component;

using a heat exchanger supported by said support member such that said heat from said electronic component generates a thermal gradient in said heat exchanger between an entry hole and an exit hole of said heat exchanger thereby causing said ambient air to move from said entry hole to said exit hole by natural convection due to said thermal gradient, wherein:

ambient air enters said entry hole, and flows through at least one channel of said heat due to said thermal gradient;

air in said channel leaves said heat exchanger through said exit hole; and air in said heat exchanger absorbs heat from a plurality of radial members connected to said support member.

16. The method of claim 15 wherein air in said heat exchanger travels adjacent to said support member without being moved by a fan.

17. The method of claim 15 wherein said entry hole faces said electronic component and air adjacent said electronic component enters said heat exchanger through said entry hole.

18. The method of claim 15 wherein ambient air further enters said heat exchanger through an external hole transverse to said electronic component.

* * * * *